United States Patent [19]

Giamei et al.

[11] Patent Number: 5,468,548

[45] Date of Patent: Nov. 21, 1995

[54] DIRECTIONALLY SOLIDIFIED EUTECTIC REINFORCING FIBERS AND FIBER REINFORCED COMPOSITES CONTAINING THE FIBERS

[75] Inventors: Anthony F. Giamei, Middletown; Earl R. Thompson, Glastonbury, both of Conn.

[73] Assignee: United Technologies Corporation, Hartford, Conn.

[21] Appl. No.: 100,879

[22] Filed: Aug. 2, 1993

[51] Int. Cl.$^6$ .............................. D04H 1/00; D02G 3/00; C04B 35/02; C04B 35/48

[52] U.S. Cl. .................... 428/294; 428/292; 428/373; 428/902; 428/903; 501/95; 501/103; 501/134

[58] Field of Search ........................... 428/294, 292, 428/902, 903, 373; 501/95, 134, 103

[56] References Cited

U.S. PATENT DOCUMENTS

| | | | |
|---|---|---|---|
| 3,124,452 | 3/1964 | Kraft | 106/57 |
| 3,790,303 | 2/1974 | Endres | 416/241 |
| 3,887,384 | 6/1975 | Hulse et al. | 106/57 |
| 4,040,890 | 8/1977 | Burrus, Jr. et al. | 156/605 |
| 4,055,447 | 10/1977 | Jackson | 148/32 |
| 4,184,900 | 1/1980 | Erickson et al. | 148/32 |
| 4,950,294 | 8/1990 | Hakamatsuka | 623/16 |
| 5,322,109 | 6/1994 | Cornie | 164/97 |

FOREIGN PATENT DOCUMENTS 0494362  7/1992  European Pat. Off. .

OTHER PUBLICATIONS

"Mechanical and Microstructural Characterization of Directionally-Solidified Alumina–Zirconia Eutectic Fibers", In Situ Compos. Proc. Symp., Meeting Date 1993.
"Controlling Microstructures in $ZrO_2(Y_2O_3)$–$Al_2O_3$ Eutectic Fibers", Haggerty et al., Cer. Eng. & Science Proc., Jul.–Aug. 1993.
"Processing, Microstructures, And Properties of $Al_2O_3$–$Y_3Al_5O_{12}$ (YAG) Eutectic Fibers", Mak et al., Cer. Eng. & Science Proc., Jul.–Aug. 1993.
HITEMP Review, vol. 1. (1992) Sayir et al.
International Search Report for PCT/US 94/07994, mailed Nov. 3, 1994; for the PCT application that corresponds to United States Application 08/100,879 (the present application).
Journal of Crystal Growth, vol. 37, No. 3, 1977, pp. 245–252; C. B. Finch et al. "Edge–Defined, Film–Fed Growth of $Mn_2SiO_4$—MnO Eutectic Composites: Effect of Die–Top Geometry on Solidification Interface Shape".
Database WPI, Week 8947, Derwent Publications Ltd., London, GB; AN 89–344745 & JP, 1 257 802.
Paper published in the McGraw Hill Encyclopedia of Science & Technology, entitled "Eutectics", vol. 5, pp. 245–247.
Paper published in the McGraw Hill Encyclopedia of Science & Technology, entitled "Alloys", vol. 1, pp. 356–359.
Notice of paper presented at The 17th Conference on Metal Matrix Carbon and Ceramic Matrix Composites, Cocoa Beach Florida, on 13 Jan. 1993 entitled "(C–73–93F) Processing, Microstructures, and Properties of $Al_2O_3Al_5O_{12}$(YAG) Eutectic Fibers" by T. Mah, T. A. Parthasarathy, and M. D. Petry, UES, Inc., Dayton, Ohio; and L. E. Matson, Materials Directorate, Wright Laboratory, Wright–Patterson AFB, Ohio (copy of paper not available).

*Primary Examiner*—James D. Withers
*Attorney, Agent, or Firm*—George J. Romanik

[57] ABSTRACT

Directionally Solidified Eutectic Reinforcing Fibers

Eutectic reinforcing fibers for high temperature composites include eutectic mixtures such as $Al_2O_3$—$Y_2O_3$, $Cr_2O_3$—$SiO_2$, $MgO$—$Y_2O_3$, $CaO$—$NiO$, and $CaO$—$MgO$. The fibers may be made by several solidification processes. The edge defined film fed growth process (EFG), however, may be especially appropriate. In this process, a seed having a known composition contacts the surface of a eutectic melt in a crucible and forms a molten film. In the present invention, the composition of the seed may be equal to the composition of the eutectic melt. As the seed is pulled upward, the molten film solidifies to form a eutectic fiber. Directional solidification occurs toward the melt.

9 Claims, 2 Drawing Sheets

30 MICRONS

DIRECTIONALLY SOLIDIFIED EUTECTIC REINFORCING FIBERS AND FIBER REINFORCED COMPOSITES CONTAINING THE FIBERS

TECHNICAL FIELD

The present invention relates generally to fibers and particularly to reinforcing fibers for high temperature composites.

BACKGROUND ART

The use of fiber reinforced composites as replacements for metals may increase in applications requiring high strength, light weight and high operating temperatures. For example, strong, high temperature materials with low density are desirable in the manufacturing of turbine blades and rocket engines. Composites such as metal matrix composites or ceramic matrix composites may be used to extend the useful operating temperature of an article and enhance properties such as strength, stiffness, and creep resistance.

Fibers for such composites should have low reactivity, high strength and effective oxidation resistance. In addition, fiber diameters between about 13 microns and about 127 microns are desired in the manufacturing of high temperature composites.

Two high temperature fibers, SiC and $Al_2O_3$, are currently most available. The SiC fibers, however, are fairly reactive and may not sufficiently resist oxidation. Moreover, SiC fibers of an appropriate diameter may be difficult to make due to inherent process limitations in the manufacturing of SiC fibers.

Similarly, $Al_2O_3$ fibers may not be entirely suitable for high temperature composites. For example, $Al_2O_3$ fibers possess low strength at elevated temperatures. Additionally, $Al_2O_3$ fibers are single phase materials and are not alloyed for increased strength as is done with many other materials.

It is also desirable for the fiber's coefficient of thermal expansion (CTE) to be similar to the matrix's CTE to prevent a high degree of internal stress between the matrix and fibers. This stress may damage either one or both constituents. For example, SiC fibers and $Al_2O_3$ fibers have low CTEs compared to most metals suitable for high temperature applications, such as nickel.

Accordingly, there exists a need for fibers with low reactivity, high strength and effective oxidation resistance for use in high temperature composites.

DISCLOSURE OF THE INVENTION

The present invention relates to fibers with low reactivity, high strength and effective oxidation resistance for use in high temperature composites.

One aspect of the invention includes a directionally solidified eutectic fiber.

Another aspect of the invention includes a fiber reinforced, high temperature composite article having a matrix and a plurality of directionally solidified eutectic reinforcing fibers dispersed in the matrix.

These and other features and advantages of the present invention will become more apparent from the following description and accompanying figures.

BEST MODE FOR CARRYING OUT THE INVENTION

The reinforcing fibers of the present invention may comprise any directionally solidified ceramic or metal eutectic mixture that provides high strength, low reactivity and effective oxidation resistance. Compositions closely approximating a eutectic mixture may also be acceptable. Preferably, the fibers will have a melting point greater than about 1600° C. and possess coupled crystal growth. The Table shows examples of eutectic systems that may be suitable for various applications.

| SYSTEM | MELT POINT (°C.) | α | β | γ |
|---|---|---|---|---|
| Binaries | | | | |
| $Al_2O_3$—BaO | 1875 | $Al_2O_3$ | $BaO·6Al_2O_3$ | |
| $Al_2O_3$—BaO | 1620 | $BaO·Al_2O_3$ | $BaO·6Al_2O_3$ | |
| $Al_2O_3$—$Y_2O_3$ | 1760 | $Al_2O_3$ | $3Y_2O_3·5Al_2O_3$ | |
| $Cr_2O_3$—$SiO_2$ | 1720 | $SiO_2$ | $Cr_2O_3$ | |
| $La_2O_3$—$ZrO_2$ | 2000 | $La_2O_3$ | $La_2Zr_2O_7$ | |
| MgO—$Y_2O_3$ | 1980 | $Y_2O_3$ | $3MgO·Y_2O_3$ | |
| MgO—$Y_2O_3$ | 2015 | MgO | $3MgO·Y_2O_3$ | |
| CaO—NiO | 1720 | CaO | NiO | |
| MgO—$Al_2O_3$ | 1850 | MgO | $MgO·Al_2O_3$ | |
| MgO—$Al_2O_3$ | 1925 | $Al_2O_3$ | $MgO·Al_2O_3$ | |
| MgO—$SiO_2$ | 1860 | MgO | $2MgO·SiO_2$ | |
| $Al_2O_3$—$SiO_2$ | 1840 | $Al_2O_3$ | $3Al_2O_3·2SiO_2$ | |
| $Al_2O_3$—$SiO_2$ | 1590 | $SiO_2$ | $3Al_2O_3·2SiO_2$ | |
| CaO—$SiO_2$ | 1730 | CaO | $2CaO·SiO_2$ | |
| CaO—$La_2O_3$ | 2300 | CaO | $La_2O_3$ | |
| CaO—MgO | 2350 | CaO | MgO | |
| Ternaries | | | | |
| $Al_2O_3$—MgO—$SiO_2$ | 1710 | MgO | $MgO·Al_2O_3$ | $2MgO·SiO_2$ |
| CaO—MgO—$SiO_2$ | 1850 | CaO | MgO | $Ca_3SiO_5$ |
| CaO—MgO—$SiO_2$ | 1790 | $Ca_2SiO_4$ | MgO | $Ca_3SiO_5$ |
| $Cr_2O_3$—MgO—$SiO_2$ | 1850 | MgO | $MgO·Cr_2O_3$ | $2MgO·SiO_2$ |
| $Al_2O_3$—$SiO_2$—$ZrO_2$ | 1750 | $Al_2O_3$ | $ZrO_2$ | $3Al_2O_3·2SiO_2$ |

In addition to the above table, eutectic systems comprising

CeO, $HfO_2$ and $ThO_2$ may also be suited for various applications.

Figure 1:
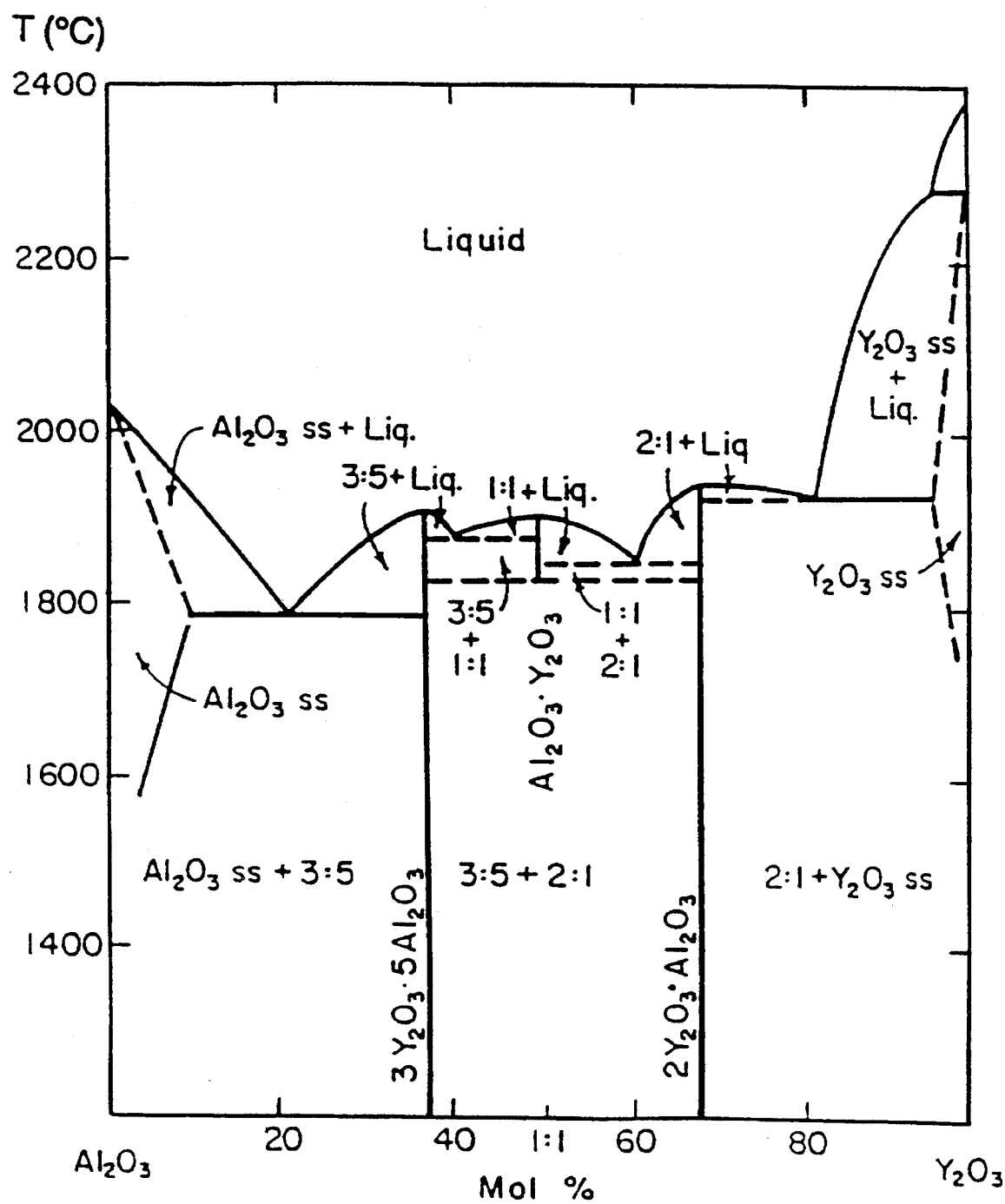
FIG. 1 is a phase diagram of $Al_2O_3$—$Y_2O_3$ mixtures.
Figure 2:
FIG. 2 is a micrograph of coupled growth in $Al_2O_3$—$Y_2O_3$.

A eutectic mixture of alumina and yttria, as shown in FIG. 1, may be suited for the fibers of the present invention. For example, $Al_2O_3$—$3Y_2O_3 \cdot 5Al_2O_3$ (Yttria Alumina Garnet) with a composition between about 18 mol % $Y_2O_3$ and about 22 tool % $Y_2O_3$ is preferred because a coupled eutectic microstructure may be produced by high gradient directional solidification. Additionally, it has an easily obtainable melting point and may be contained as a liquid in a refractory metal crucible. A eutectic mixture between about 39 mol % $Y_2O_3$ and about 43 mol % $Y_2O_3$ may also be acceptable. Similarly, a composition between about 58 mol % $Y_2O_3$ and about 62 mol % $Y_2O_3$ may be useful, as well as a composition between about 78 mol % $Y_2O_3$ and about 82 mol % $Y_2O_3$. Fiber diameters between about 13 microns and about 127 microns are suitable for high temperature composites. Preferably, the fiber diameters will be between about 25 microns and about 100 microns for the reinforcement of metals. Larger fibers reduce the surface to volume ratio which minimizes the effect of chemical interactions between a matrix and fiber. Smaller fiber diameters between about 10 microns to about 20 microns, however, are preferred for the reinforcement of ceramic matrix composites. As shown in FIG. 2, for $Al_2O_3$—$Y_2O_3$ coupled growth is desired to enhance the stability of the eutectic fiber by achieving fiber alignment and low energy interfaces.

The fibers of the present invention may be made by several solidification processes. The edge defined film fed growth process (EFG) may be especially appropriate. In this process, a seed having a known composition contacts the surface of a eutectic melt in a crucible and forms a molten film. In the present invention, the composition of the seed may be equal to the composition of the eutectic melt. Alternatively, a cold finger or a high melting point material which has a small contact angle with a liquid may be used to initiate fiber growth. As the seed is pulled upward, the molten film directionally solidifies to form a eutectic fiber. Directional solidification occurs toward the melt. Preferably, several eutectic fibers will be drawn at a time from multiple seeds and a die with multiple cavities. The melt level may be held constant in the crucible by the gradual insertion of a compensation feed rod of the eutectic melt composition. Alternatively, multiple rods of the constituent phases with proper ratio of diameter and feed rate to exactly compensate the melt may be used to keep the level constant in the crucible.

The eutectic fibers of the present invention may be used as reinforcing fibers for composite articles that will be subjected to high temperatures. For example, the eutectic fibers may be used in gas turbine engines, turbine blades, vanes, and nozzles. A fiber reinforced, high temperature composite article may comprise a matrix and a plurality of directionally solidified eutectic reinforcing fibers dispersed in the matrix. The matrix may be any metal matrix, intermetallic matrix or ceramic matrix compatible with the fibers. Preferably, the matrix is a high temperature metal alloy such as a nickel, niobium or molybdenum alloy. In addition, the CTE of the eutectic fiber should be similar to the matrix's CTE to avoid potentially deleterious effects of residual stress. This stress is produced by fiber matrix thermal expansion mismatch. The CTEs of the fiber and matrix should also be similar to avoid large cyclic thermal stresses, cracking and distortion. The CTEs of the matrix and fiber may be within 25% of each other. Preferably, the CTEs will be within 10% of each other. Composites of the present invention may be made by any suitable conventional method.

The present invention offers several advantages over the prior art. Previously, only two high temperature fibers, SiC and $Al_2O_3$, were commonly available. These fibers may be inadequate for many high temperature operations since an optimal fiber must possess a combination of low reactivity, high strength and effective oxidation resistance. For example, prior art SiC fibers are chemically reactive with most high temperature metal alloys such as Ti, Ni, and Nb. In addition, SiC fibers may not effectively resist the effects of oxidation. The prior art $Al_2O_3$ fibers possess low strength at elevated temperatures.

Eutectic fibers of the present invention, however, possess high strength at elevated temperatures because the eutectic fibers are self-reinforced by distributed, aligned phases. Eutectic fibers also possess excellent oxidation resistance in systems such as oxide-oxide systems because the fiber compositions may be selected to exhibit this characteristic. In addition, oxides with CTEs greater than alumina are desirable reinforcing agents for metals, such as nickel, which are suitable for high temperature operations. Due to the numerous eutectic systems available, it should be easier to minimize thermal expansion mismatch between the matrix and fiber by selecting an appropriate eutectic system. Eutectic reinforcing fibers are also thermodynamically stable and possess high melting points. Consequently, the reinforcing fibers may exhibit low reactivity with most matrices. Thus, the present invention can result in more effective reinforcing fibers for high temperature composites than previously possible.

The invention is not limited to the particular embodiments shown and described herein. Various changes and modifications may be made without departing from the spirit or scope of the claimed invention.

We claim:

1. A directionally solidified eutectic fiber comprising a eutectic mixture of $Al_2O_3$ and $Y_2O_3$, wherein the eutectic fiber has a composition between about 39 mol % $Y_2O_3$ and about 43 mol % $Y_2O_3$.

2. A directionally solidified eutectic fiber comprising a eutectic mixture of $Al_2O_3$ and $Y_2O_3$, wherein the eutectic fiber has a composition between about 78 mol % $Y_2O_3$ and about 82 mol % $Y_2O_3$.

3. A fiber reinforced, high temperature composite article comprising a matrix and a plurality of directionally solidified eutectic fibers dispersed in the matrix, wherein the matrix has a coefficient of thermal expansion within 25% of the coefficient of thermal expansion of the eutectic fiber and comprises a noneutectic material.

4. The fiber reinforced, high temperature composite article of claim 3 wherein the article is a turbine blade.

5. The fiber reinforced, high temperature composite article of claim 3 wherein the eutectic fiber comprises a eutectic mixture of oxides selected from the group consisting of $Al_2O_3$, BaO, CaO, $Cr_2O_3$, $La_2O_3$, MgO, $SiO_2$, $Y_2O_3$, $ZrO_2$, CeO, $HfO_2$, and $ThO_2$.

6. The fiber reinforced, high temperature composite article of claim 3 wherein the eutectic fiber comprises a eutectic mixture of $Al_2O_3$ and $Y_2O_3$.

7. The fiber reinforced, high temperature composite article of claim 6 wherein the eutectic fiber has a composition between about 18 mol % $Y_2O_3$ and about 22 mol % $Y_2O_3$.

8. The fiber reinforced high temperature composite article of claim 6 wherein the eutectic fiber has a composition between about 39 mol % $Y_2O_3$ and about 43 mol % $Y_2O_3$.

9. The fiber reinforced, high temperature composite article of claim 6 wherein the eutectic fiber has a composition between about 78 mol % $Y_2O_3$ and about 82 mol % $Y_2O_3$.

* * * * *